(12) United States Patent
Fischer et al.

(10) Patent No.: US 9,054,162 B2
(45) Date of Patent: Jun. 9, 2015

(54) METHOD AND AN APPARATUS FOR FORMING ELECTRICALLY CONDUCTIVE VIAS IN A SUBSTRATE, AN AUTOMATED ROBOT-BASED MANUFACTURING SYSTEM, A COMPONENT COMPRISING A SUBSTRATE WITH VIA HOLES, AND AN INTERPOSER DEVICE

(76) Inventors: Andreas Fischer, Stockholm (SE); Göran Stemme, Lindingo (SE); Frank Niklaus, Taby (SE)

( * ) Notice: Subject to any disclaimer, the term of this patent is extended or adjusted under 35 U.S.C. 154(b) by 70 days.

(21) Appl. No.: 13/988,796

(22) PCT Filed: Nov. 21, 2011

(86) PCT No.: PCT/SE2011/051396
§ 371 (c)(1),
(2), (4) Date: Jul. 16, 2013

(87) PCT Pub. No.: WO2012/071002
PCT Pub. Date: May 31, 2012

(65) Prior Publication Data
US 2013/0285256 A1    Oct. 31, 2013

(30) Foreign Application Priority Data

Nov. 22, 2010 (SE) ...................................... 1001125

(51) Int. Cl.
*H01L 21/768* (2006.01)
*H01L 21/48* (2006.01)
(Continued)

(52) U.S. Cl.
CPC ........ *H01L 21/76879* (2013.01); *H01L 21/486* (2013.01); *H01L 21/76898* (2013.01); *H01L 23/147* (2013.01); *H01L 23/481* (2013.01); *H01L 23/49866* (2013.01); *H01L 2924/09701* (2013.01); *H01L 2224/131* (2013.01);
(Continued)

(58) Field of Classification Search
USPC ...................................................... 336/40, 73
See application file for complete search history.

(56) References Cited

U.S. PATENT DOCUMENTS 3,736,651 A    6/1973  Law et al.
5,368,220 A    11/1994 Mizuhara et al.
(Continued)

FOREIGN PATENT DOCUMENTS

EP         1548884 A1    6/2005
WO    WO-2004052547 A2    6/2004

OTHER PUBLICATIONS

International Search Report PCT/ISA/210 for PCT/SE2011/051396 dated Feb. 21, 2012.
(Continued)

*Primary Examiner* — Yasser A Abdelaziez
(74) *Attorney, Agent, or Firm* — Harness, Dickey & Pierce

(57) ABSTRACT

A method is disclosed for forming conductive vias in a substrate by filling preformed via holes, preferably through via holes, with conductive material. The method includes providing a plurality of preformed objects at least partly including ferromagnetic material on a surface of the substrate; providing a magnetic source on an opposite side of the substrate with respect to the plurality of preformed objects, thereby at least partly aligning at least a portion of the preformed objects with a magnetic field associated with the magnetic source; and moving the magnetic source relative the substrate, or vice versa, thereby moving the at least portion of the preformed objects into at least a portion of the via holes.

24 Claims, 10 Drawing Sheets

(51) Int. Cl.
*H01L 23/48* (2006.01)
*H01L 23/14* (2006.01)
*H01L 23/498* (2006.01)

(52) U.S. Cl.
CPC . *H01L2924/0001* (2013.01); *H01L 2924/1461* (2013.01)

(56) References Cited

U.S. PATENT DOCUMENTS

| | | | |
|---|---|---|---|
| 5,600,530 | A | 2/1997 | Smith |
| 7,200,920 | B2 | 4/2007 | Schuster |
| 7,393,471 | B2 | 7/2008 | Inoue et al. |
| 7,528,006 | B2 | 5/2009 | Arana et al. |
| 2004/0113752 | A1 | 6/2004 | Schuster |
| 2005/0250229 | A1* | 11/2005 | Nuggehalli et al. ............ 438/24 |
| 2005/0285253 | A1 | 12/2005 | Takashi |
| 2006/0084297 | A1 | 4/2006 | Inoue et al. |
| 2006/0166490 | A1 | 7/2006 | Takashi |
| 2007/0001266 | A1 | 1/2007 | Arana et al. |
| 2010/0193952 | A1 | 8/2010 | Arana et al. |

OTHER PUBLICATIONS

International Preliminary Report on Patentability dated May 22, 2013 issued in corresponding International Application No. PCT/SE2011/051396.

* cited by examiner

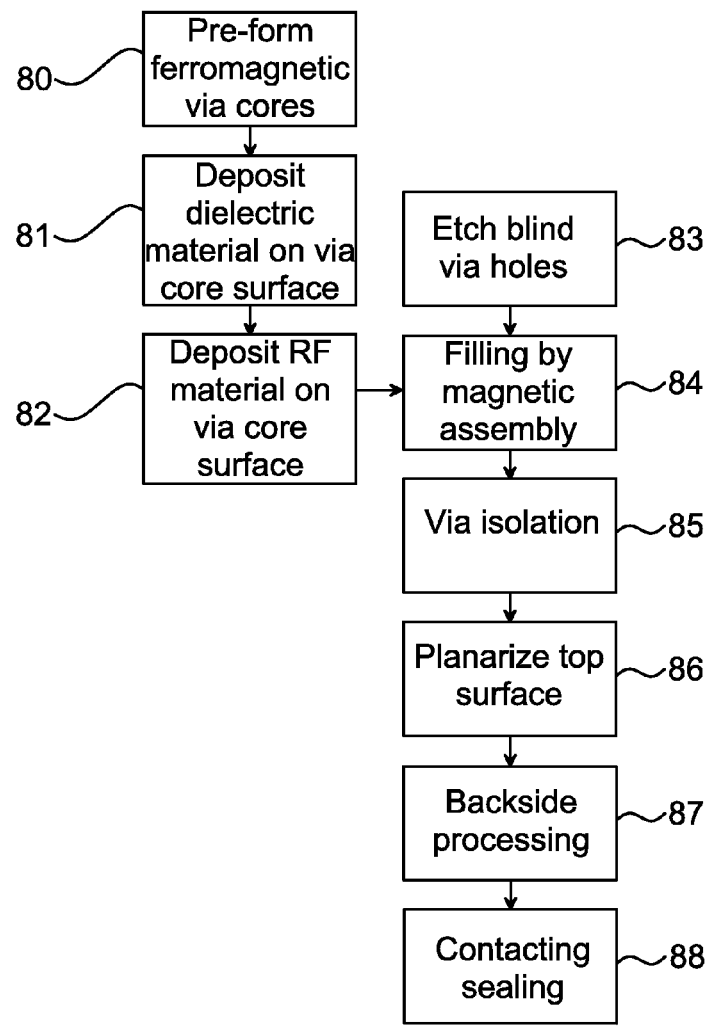
Fig. 8a
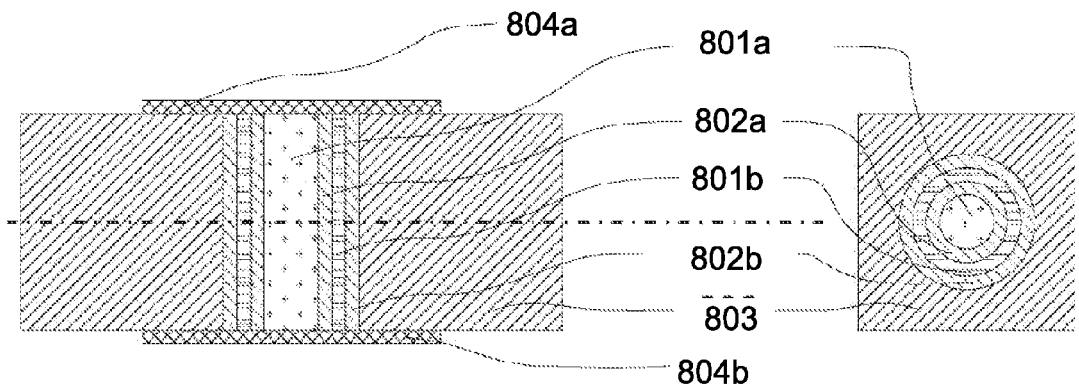
Fig. 8b                    Fig. 8c

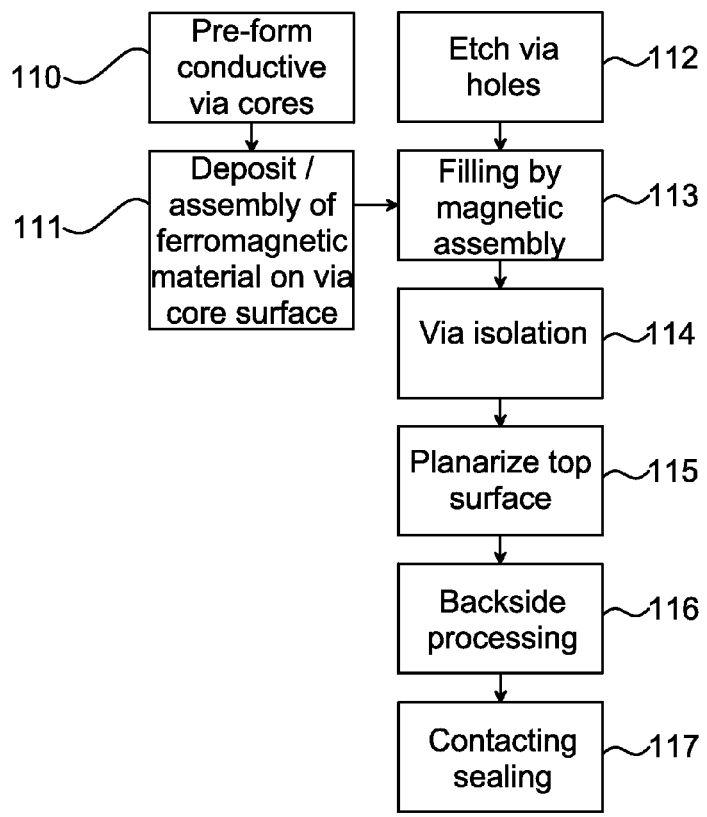
Fig. 10a
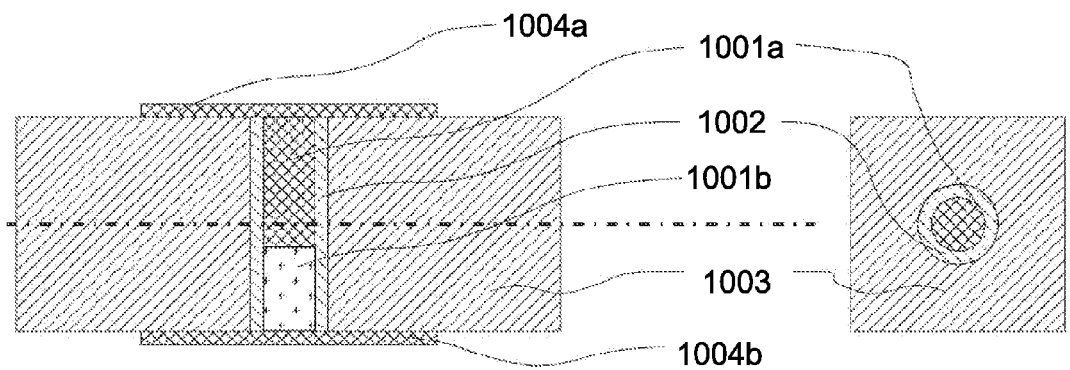
Fig. 10b
Fig. 10c

METHOD AND AN APPARATUS FOR FORMING ELECTRICALLY CONDUCTIVE VIAS IN A SUBSTRATE, AN AUTOMATED ROBOT-BASED MANUFACTURING SYSTEM, A COMPONENT COMPRISING A SUBSTRATE WITH VIA HOLES, AND AN INTERPOSER DEVICE

This application is the national phase under 35 U.S.C. §371 of PCT International Application No. PCT/SE2011/051396 which has an International filing date of Nov. 21, 2011, which claims priority to Swedish patent application number 1001125-2 filed Nov. 22, 2010.

TECHNICAL FIELD

The invention relates to the formation of electrically conductive vias in substrates, preferably electrically conductive vias extending through the substrate, and to devices comprises electrically conductive vias.

BACKGROUND

The hybrid integration of IC and MEMS technology was dominated during the past decades by two-dimensional side-by-side approaches for Multi Chip Modules (MCM) and Systems on Chips (SoC). CMOS and MEMS processing are both well-established and cost-effective base technologies where each technology itself is typically characterized by short development times, low fabrication costs and high yields. The separate manufacturing of CMOS and MEMS and the integration of both devices as a final step in packaging is, in terms of process costs and versatility, an attractive alternative to Systems on Chips, where these two technologies are laborious merged onto a common die. The trend in many integration concepts moves therefore clearly towards three-dimensional integrated System in Packages (SiP). This vertical integration by chip stacking does not only decrease the costs by reducing the package size, its volume and weight, but also improves the systems performance in terms of enhanced transmission speed, lower power consumption, and lower parasitic capacitances due to shorter signal lengths, which is of importance for various demanding applications. These integration concepts require vertical interconnects which lead through certain chips/substrates/carriers of the stack in order to connect its functional layers. Large developing efforts for the realization of reliable and cost-effective Through-Silicon Vias (TSV's) are currently on-going and first commercial products have already successfully incorporated this technology.

The structure and thus the fabrication of TSV's can be roughly divided into three major elements as being illustrated in FIG. 1, which illustrates, in a cross-sectional view, a component 107 comprising a substrate, chip, or carrier 104 of insulating or semiconducting material, for example silicon, glass ceramic or others, with a plurality of TSV's: through holes 101 going through the substrate 104, an electrically conductive core 102 comprising metallic or semi-metallic conductive via material, and a dielectric material 103 acting as an insulator between the electrically conductive core 102 and the substrate 104. Each TSV forms a vertical electrical interconnection between the front and back sides of the substrate 104. As an example, each TSV connect to a redistribution layer 105 on one side of the substrate for connection to integrated circuits or associated devices, optical or optoelectronic elements, micromechanical or micro-electromechanical elements, additional wiring, etc., which are disposed in the layer 105; and to solder bumps 106 on an opposite side of the substrate 104 for connection to next level. The actual design of the TSV's depends very much on the application and its demands.

The most popular process techniques for the fabrication of the TSV's are in the following briefly discussed:

Various methods for the formation of via holes exist and can be categorized into dry etching, wet etching, and drilling processes. All processes have their own characteristics and thus result in different physical properties of the via holes. The diameter of the via holes depends strongly on the application and varies typically between 1 µm and 1200 µm. Vertically straight sidewalls are typically fabricated for solid metal-filled TSV's with small diameters, whereas tapered sidewall profiles are used for metal-lined TSV's with rather larger diameters.

The predominantly used processes for the via hole formation so far are Deep Reactive Ion Etching (DRIE), Water Jet Drilling, Sand Blasting, and Laser Ablation. DRIE is by far the most commonly used technology to form the via holes due to its excellent process controllability and its capability to create high aspect ratio vias and various profiles of the sidewalls. Using Laser Ablation to drill the via holes benefits from the absence of any lithographic process steps and the non-selectivity towards different material stacks. This allows a very flexible processing and fast incorporation of design changes. However this method suffers from a high local thermal load creating pores and micro-cracks and a dust particle generation and a deformation concentrically to the drilled via holes, which may lead to reliability issues. Methods like micro drilling, powder blasting, cryogenic etching, wet etching techniques such as photo-electrochemical etching have also been reported but are not broadly applied yet. Traditional substrate thicknesses are in the range of 0.01 mm to 3 mm with through via aspect ratios in the range of 1:1 to 30:1. The dimensions depend strongly on the application and I/O count.

The metallization step is the most critical and costly part of the via fabrication. Especially the electroplating of copper as a very well established semiconductor process is widely used in most research groups within industry and university to form the conducting path. The process benefits from its good availability and processability of high aspect ratio features at close to room temperature conditions but is however not yet economically attractive due to its complexity. Especially the void-free metal formation of high aspect ratio features is a big challenge. The cost target of currently applied TSV processes is about 200 USD per 200 mm wafer. A major part in this cost structure is the metal filling with about 20-30% of the total costs. Alternative approaches to plating processes are therefore investigated, such as the filling of the via holes with conducive metal pastes, the use of polysilicon or low resistivity silicon as conductor.

Filling of high aspect ratio vias, with a height in the range of 10 µm to 100 µm and a diameter in the range of 1 µm to several hundred µm's is challenging. A popular technique for filling blind vias or through vias of microscale diameters is electroplating of cupper. However, the hydrodynamics, the ionic concentrations, and the diffusivities limit the filling of deep blind holes.

Chemical Vapour Deposition (CVD) of silicon dioxide is a well-established CMOS process and therefore often used for forming the insulator surrounding the conductor because of its moderate temperature conditions. Organic dielectrics such as benzocyclobutene (BCB), $SU_8$, or parylene are also used. The polymers are typically applied by conventional spin-on or parylene deposition processes as well as by spray coating. Most of the TSV concepts use a very thin insulating layer in order to minimize the via diameter and pitch.

SUMMARY

It is an object of the present invention to provide a method and an apparatus for forming conductive vias in a substrate at lower a cost than what is possible today.

It is a further object of the invention to provide such method and apparatus which enable the formation of void-free through substrate vias with high aspect ratios.

It is still a further object of the invention to provide such method and such apparatus which are rapid, simple, robust, effective, precise, accurate, reliable, safe, and easy to use.

These objects among others are, according to the present invention, attained by methods and apparatuses as claimed in the appended patent claims.

According to one aspect of the invention, a method for forming conductive vias in a substrate by filling preformed via holes, preferably through via holes, with conductive material is provided. According to the method a plurality of preformed objects at least partly comprising ferromagnetic material, e.g. in the form of commercially available wires, are arranged on a surface of the substrate, a magnetic source is arranged on an opposite side of the substrate with respect to the plurality of preformed objects, thereby at least partly aligning at least a portion of the preformed objects with a magnetic field associated with the magnetic source; and the magnetic source is moved relative the substrate, thereby moving the at least portion of the preformed objects into at least a portion of the via holes.

By such method a rapid metal filling technique is provided, which enables through wafer/substrate vias with high aspect ratios and potentially eliminates characteristic cost drivers of the TSV production such as plating, wafer thinning, and general issues associated with thin wafer handling. Main fabrication objectives of state-of-the-art TSV's such as reliable fabrication of high aspect ratio TSV's, void-free solid metallization, sufficient thermo-mechanical stability, and reduction of fabrication costs are addressed by the presented concept.

Preferably, the preformed objects in the via holes are fixated therein by filling the space between the objects and the sidewalls of the via holes with a filler material, preferably a dielectric filler material. Hereby, a mechanically stable structure with well defined conduction paths is obtained.

The preformed objects may each comprise a core and a layer formed thereon, wherein the core may be of an electrically conductive material and the layer formed thereon may be of a ferromagnetic material, or vice versa, i.e. the core may be of a ferromagnetic material and the layer formed thereon may be of an electrically conductive material. Hereby, the objects may be good electrical conductors and simultaneously be easily aligned and moved into via holes by means of the magnetic source.

Alternatively, the preformed objects comprise each a multilayer structure including at least two parallel conductors, preferably arranged coaxially, electrically isolated from one another. Hereby, a single TSV provides two electrical conduction paths or a coaxial conductor.

Yet alternatively, the preformed objects may each comprise a first end portion and a second end portion opposite to the first end portion, and the first end portion is of an electrically conductive material and the second end portion is of a ferromagnetic material. This is of particular interest when no through substrate electrical conductor is required.

In one embodiment no filler material is deposited between the objects and the sidewalls of the via holes for fixation of the preformed objects in the via holes. Instead, the preformed objects comprise each a core of a ferromagnetic material and a layer of an expandable dielectric material formed thereon, and the preformed objects in the via holes are fixated therein by means of expanding the expandable dielectric layer. Hereby, the fabrication is even further speeded up, and the fabrication costs will be reduced; no depositing of filler material is required.

After that the preformed objects have been moved into the at least portion of the via holes and been fixated therein, the surface of the substrate, on which the preformed objects at least partly comprising ferromagnetic material are provided, may be planarized. After planarization, the via holes can be hermetically sealed, e.g. by means of covering them by at least one layer, preferably an electrically conductive layer, after the preformed objects have been moved into the via holes. If the via holes are through holes both ends have to be covered in order to seal the via holes hermetically. Various further post-processing steps may be applied depending on the particular application and its demands.

According to another aspect of the invention, an apparatus for forming conductive vias in a substrate by filling preformed via holes with conductive material is provided. The apparatus comprises a magnetic source arranged below the substrate for providing a magnetic field, thereby at least partly aligning at least a portion of a plurality of preformed objects arranged on an upper surface of the substrate, and means for moving the magnetic source relative to the substrate, thereby moving the at least portion of the preformed objects into at least a portion of the via holes.

Preferably, the means for moving is provided for moving the magnetic source relative to the substrate in different horizontal directions, and optionally in a vertical direction.

Further, a substrate holder arranged to hold the substrate during the movement of the magnetic source relative to the substrate may be provided.

In one embodiment, the apparatus comprises a detection device for detecting the amount of the preformed objects that has been moved into the at least portion of the via holes. The detection device may be a device for detecting preformed objects in the via holes optically, electromagnetically, or physically.

In a further embodiment, the apparatus comprises a robot and is arranged to (i) hold the magnetic source during the movement of the magnetic source relative to the substrate and to hold the detection device during the detection of the amount of the preformed objects that has been moved into the at least portion of the via holes; or to (ii) hold the substrate during the movement of the magnetic source relative to the substrate and during the detection of the amount of the preformed objects that has been moved into the at least portion of the via holes The present invention is also related to a component comprising a substrate with via holes, each of which being filled with an object comprising electrically conductive material and ferromagnetic material and being surrounded by dielectric material fixating the object in the via hole, as well as to an interposer device comprising a plurality of the above components in a stacked fashion wherein at least some of the via holes are through holes and each of the objects filling the through holes provides electrical connection from one to another one of the components. Such interposer device may have the substrates made of glass or a semiconductor material such as silicon.

Advantages of the present invention comprise e.g. the following ones.

Realization of high aspect ratio TSV's is enabled. The use of preformed conductive objects comprising ferromagnetic material (e.g. in the form of commercially available wire)

enables the fabrication of almost any aspect ratio. High aspect ratio TSV's are preferable for certain application fields and full through vias can eliminate wafer thinning and connected thin wafer handling issues.

Void-free fabrication of conductive TSV cores is enabled. The use of preformed conductive objects (e.g. in the form of commercially available wire) leads to void-free metallization unlike most deposited state-of-the-art metallization such as e.g. electroplating, CVD, and the like. Voids in metallization are unwanted since they can lead to several reliability issues, such as electrical and mechanical reliability and corrosion.

Thermo-mechanical stability of the vias is achievable. The conductive core, which is typically a metal, has a higher coefficient of thermal expansion (CTE) compared to the surrounding substrate material, which is typically silicon. This mismatch may cause various mechanical and electrical failures at elevated temperatures, where the core material cracks or breaks the substrate material and/or delaminates from the contact metallization. The use of a comparable thick and soft insulating material enables the compensation of CTE mismatches of the different via materials. It will act as a thermomechanical buffer at elevated temperatures.

Superior electrical performance due to low-k insulating material is achievable. The use of a low-k (lower permittivity than $SiO_2$, which is most commonly used) insulating material increases the electrical performance of the vias (i.e. the coupling capacity).

Low demands are put on the via hole formation process. The insulation process can take part subsequently to the via metallization step by means of the magnetic assembly.

The absence of any seed layer deposition steps (e.g. for cupper electroplating) lowers the demands on the topography of the via sidewalls significantly. This can increase the yield and throughput of the via hole formation process.

Further characteristics of the invention, and advantages thereof, will be evident from the following detailed description of preferred embodiments of the present invention given hereinafter and the accompanying FIGS. 1-12, which are given by way of illustration only, and are thus not limitative of the present invention.

BRIEF DESCRIPTION OF THE DRAWINGS

FIGS. 4a-10a are each flow chart of a representative process flow for fabricating a component comprising a substrate with a plurality of TSV's according to a respective embodiment of the invention. FIGS. 4b-10b illustrate, in cross-sectional views, portions of the components fabricated according to the flow charts of FIGS. 4a-10a. FIGS. 4c-10c are cross-sectional views of the portions of the components along the dash-dotted lines of FIGS. 4b-10b.

DETAILED DESCRIPTION

Figure 1:
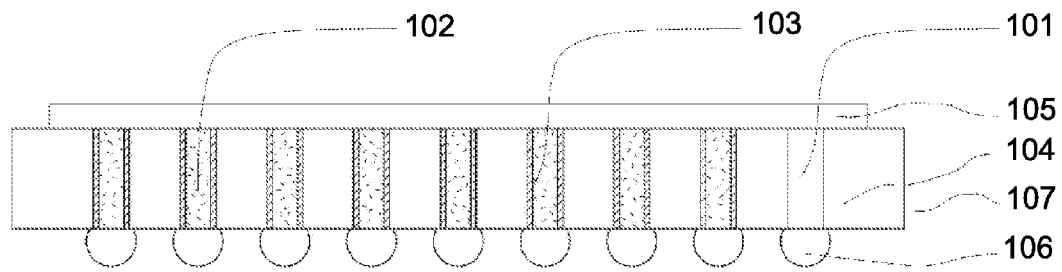
FIG. 1 illustrates, in a cross-sectional view, a component comprising a substrate with a plurality of TSV's according to prior art.
Figures 2A, 2B:
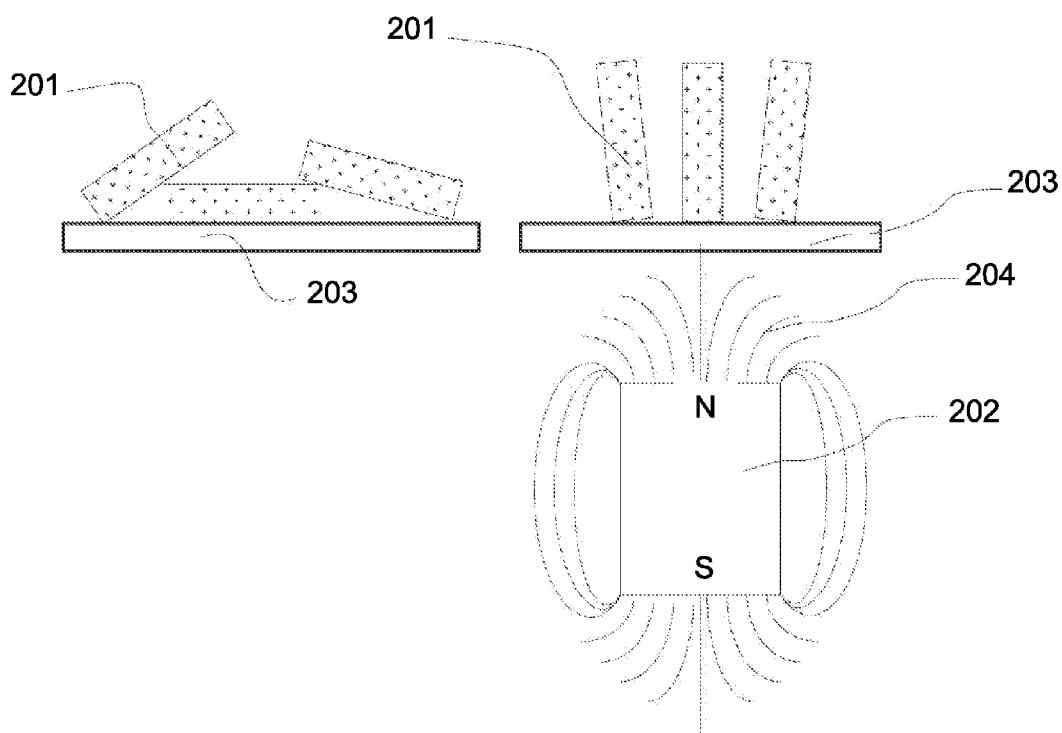
FIGS. 2a-b illustrate, in side elevation views, the physical effect of a magnetic field used in the present invention.

FIGS. 2a-b provide a representative illustration of the physical effect of a magnetic field 204 from a magnetic source 202 on preformed objects 201 at least partly comprising ferromagnetic material arranged on a substrate 203. FIG. 2a shows the preformed objects 201 in disorder on the upper surface of the substrate 203 which may be of insulated or semiconducting material, for example silicon, glass, ceramic, or other material. FIG. 2b shows how the preformed objects 201 align towards the field lines of the applied magnetic field 204.

Figure 3:
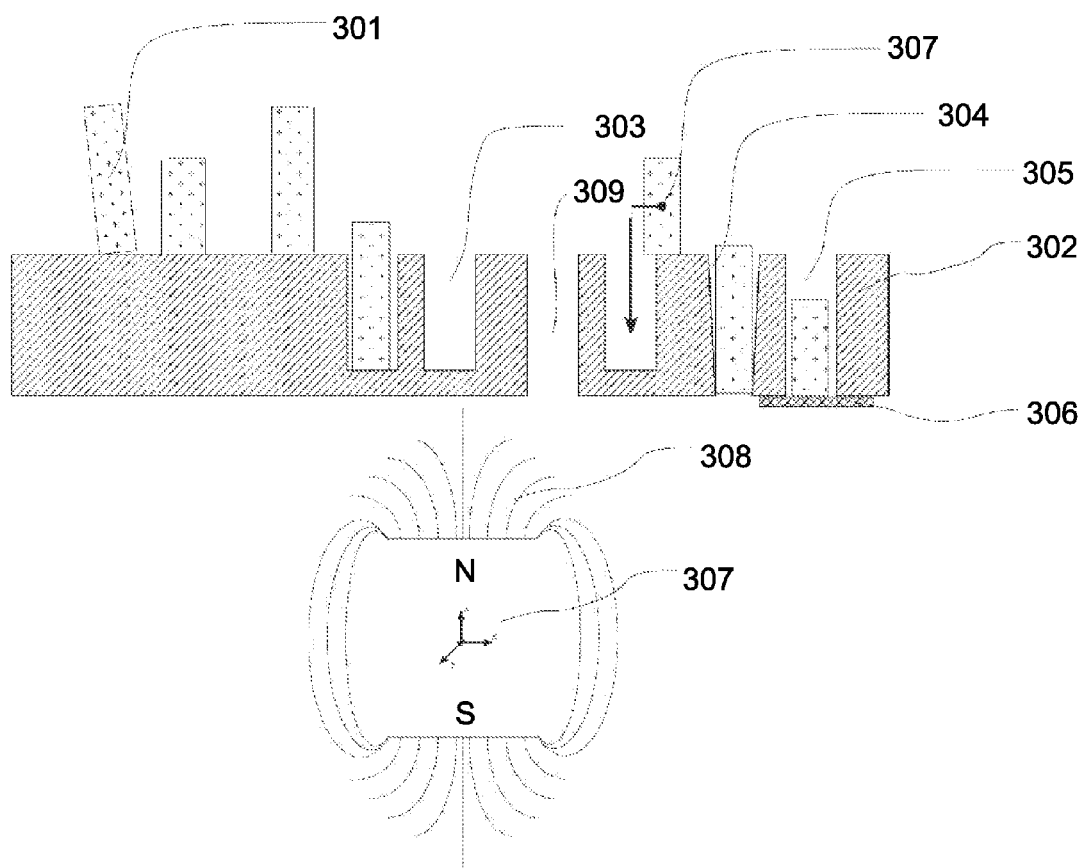
FIG. 3 illustrate, in cross-sectional view, a component comprising a substrate with a plurality of via holes during a method for forming conductive vias according to an embodiment of the present invention.

FIG. 3 provides a representative illustration of a magnetic assembly method according to one embodiment of the invention. The magnetic source 307 can be moved in either a random or a controlled manner in two horizontal directions, or in all three dimensions. The preformed objects 301 at least partly comprising ferromagnetic material will follow the magnetic field 308 when the movement of the magnetic source 307 is present. This effect is used to move and/or steer, as at 307 representatively illustrated, the preformed objects 301 at least partly comprising ferromagnetic material to certain positions either directly on the substrate 302 made of insulated or semiconducting material or into through holes 309, blind via holes 303, tapered through holes 304 or straight through holes 305 with an additional layer 306 on the backside of the carrier 302 or any combination(s) of either of them. The type of movement of the magnetic source 307 and thus the type of movement of the preformed objects 301 at least partly comprising ferromagnetic material may be conducted in a random and/or a controlled manner and/or a in a controlled manner with a position feedback, e.g. by an optical recognition system (not illustrated). The via holes 303 might have several cross-sectional shapes such as round, rectangular, quadratic, or any arbitrary shapes. The preformed objects 301 at least partly comprising ferromagnetic material 301 may be made of for example Fe, Co, Ni, or an alloy comprising a ferromagnetic material. While the preformed objects 301 at least partly comprising ferromagnetic material can be of any geometric shape, they are preferably made from a cylindrical wire.

Figure 4A:
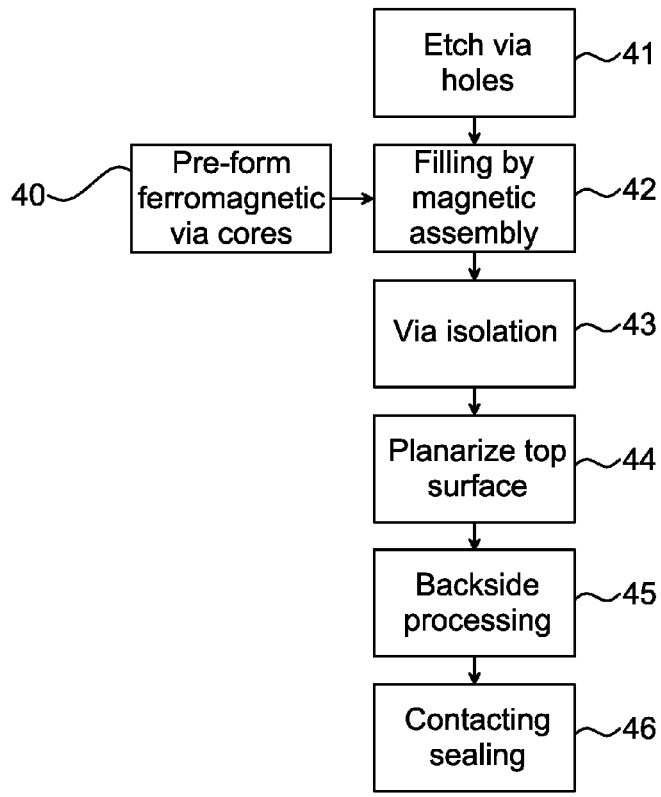
Figures 4B, 4C:
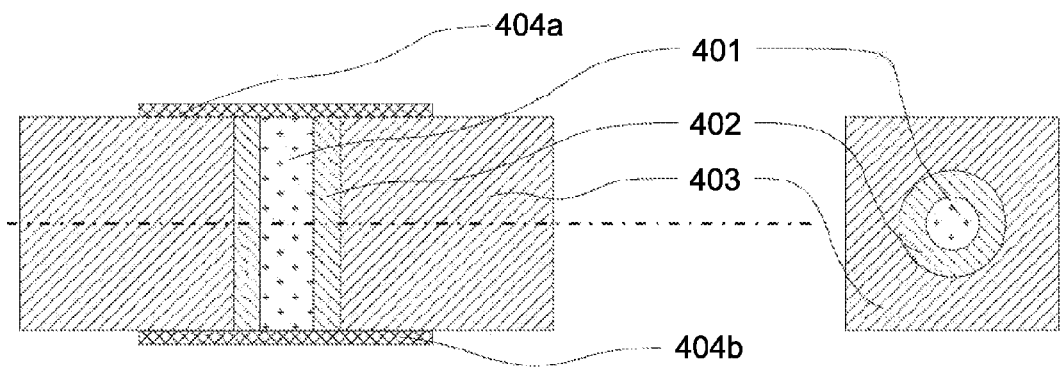

In a further embodiment, a method for fabricating a component comprising a substrate with TSV's, including the arrangement of multiple preformed electrically conductive objects at least partly comprising ferromagnetic material in through substrate via holes by a magnetic assembly process, is provided as being illustrated in FIGS. 4a-c.

FIG. 4a is a flow chart of a representative process flow for fabricating a component comprising a substrate with TSV's. The preformed objects at least partly comprising ferromagnetic material are pre-fabricated in step 40. The vias are etched in step 41 into the substrate material to a depth, which is the desired depth of the vias in the finished product. Methods may include using standard etching, drilling, or powder blasting techniques known in the art.

The magnetic assembly method is performed in step 42 with the respective preformed objects at least partly comprising ferromagnetic material. The preformed objects may comprise any of the ferromagnetic materials Ni, Co, and/or Fe. The preformed objects are arranged on a surface of the substrate and the magnetic source is provided on an opposite side of the substrate with respect to the plurality of preformed objects, thereby at least partly aligning at least a portion of the preformed objects with a magnetic field associated with the magnetic source. Finally, the magnetic source is moved relative the substrate, thereby moving the at least portion of the preformed objects into at least a portion of the via holes.

Step 43 may serve as insulation, filling of the remaining volume and mechanical fixation of the preformed objects in the via holes. Methods may include standard deposition techniques such as e.g. PECVD, PVD, spin-on, sol-gel, bladder-fill, and manual application of dielectrics such as e.g. polymers, ceramics, or glass, as being known in the art. Some material may require a subsequent thermal cure or sinter. In step 44, the top surface is planarized to remove any materials deposited thereon in prior steps. Optionally, grinding and polishing processes on the backside of the substrate in step 45 may be used for thinning down the substrate. Finally, in step 46 the TSV's are also electrically contacted and/or hermetically encapsulated by the deposition and structuring of a conductive material on either side of the substrate.

FIGS. 4b-c illustrate a portion of the fabricated component comprising the substrate with one TSV. The preformed object 401 may be shorter, higher, or have the same height as the via hole. The object 401 is embedded in a dielectric material 402, which mechanically fixates and electrically insulates the conductive core 401 from the substrate 403. The dielectric materiel 402 consists of any organic material, such as e.g. a polymer, or inorganic material, such as e.g. glass or a ceramic, and may be deposited prior or subsequently to the magnetic assembly. The substrate 403 consists of any organic material, such as e.g. a polymer, inorganic material, such as e.g. glass or a ceramic, or a semiconducting material such as e.g. silicon or gallium arsenide. Conductive layers 404a, 404b serve as electrical contact and optionally as hermetic enclosure of the TSV. The conductive ferromagnetic material in the through vias may be placed in electrical contact with additional multilevel wiring, integrated circuits, or associated devices, optical or optoelectronic elements, micro-electromechanical elements.

Figure 5A:
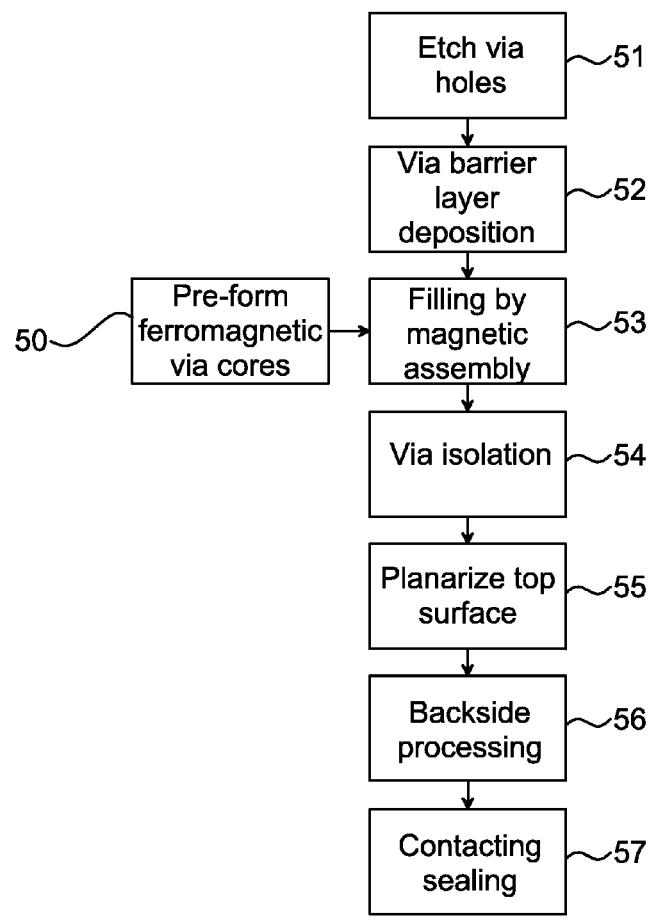
Figures 5B, 5C:
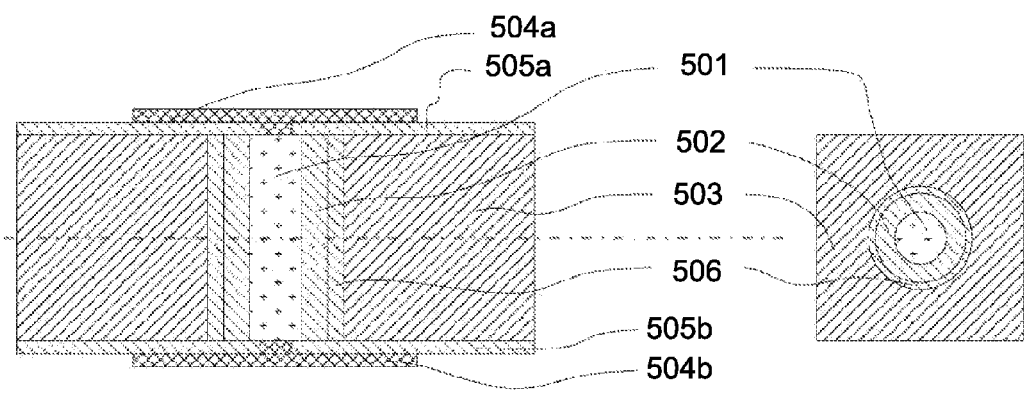

In a still further embodiment, a method for fabricating a component comprising a substrate with TSV's, including the arrangement of multiple preformed electrically conductive objects at least partly comprising ferromagnetic material in through substrate via holes by a magnetic assembly process, is provided as being illustrated in FIGS. 5a-c. This embodiment differs from the embodiment of FIGS. 4a-c in that a passivation layer is formed at the inner side walls of the via holes and/or on the upper and/or lower surface of the substrate prior to the arrangement of the preformed objects in the via holes.

FIG. 5a is a flow chart of a representative process flow for fabricating a component comprising a substrate with TSV's. The preformed objects at least partly comprising ferromagnetic material are pre-fabricated in step 50. The vias are etched in step 51 into the substrate material, and the passivation layer 505a, the passivation layer 505b, and/or the passivation layer are/is formed in step 52. The passivation layers 505a, 505b, and 506 may be comprised of $SiO_2$, $Si_3N_4$, glass, ceramics, epoxy, SiN, polymers or other material. Methods may include standard deposition techniques such as e.g. PECVD, PVD, spin-on, sol-gel, bladder-fill, and manual application. Some material may require a subsequent thermal cure or sinter. The magnetic assembly method is performed in step 53 as described above. A filler is deposited in the via holes in step 54 providing electrical insulation as well as mechanical fixation of the preformed objects in the via holes. The top surface is planarized to remove any materials deposited thereon in step 55. Optionally, grinding and polishing processes on the backside of the substrate in step 56 may be applied for thinning down the substrate. Finally, in step 57 the TSV's are also electrically contacted and/or hermetically encapsulated by the deposition and structuring of a conductive material 504a, 504b on either side of the substrate.

FIGS. 5b-c illustrate a portion of the fabricated component comprising the substrate 503 with one TSV comprising the preformed object 501 and the dielectric filler material 502. The passivation layers, 505a, 505b, and 506 as well as the metallization layers 504a and 504b contacting the TSV are illustrated.

Figure 6A:
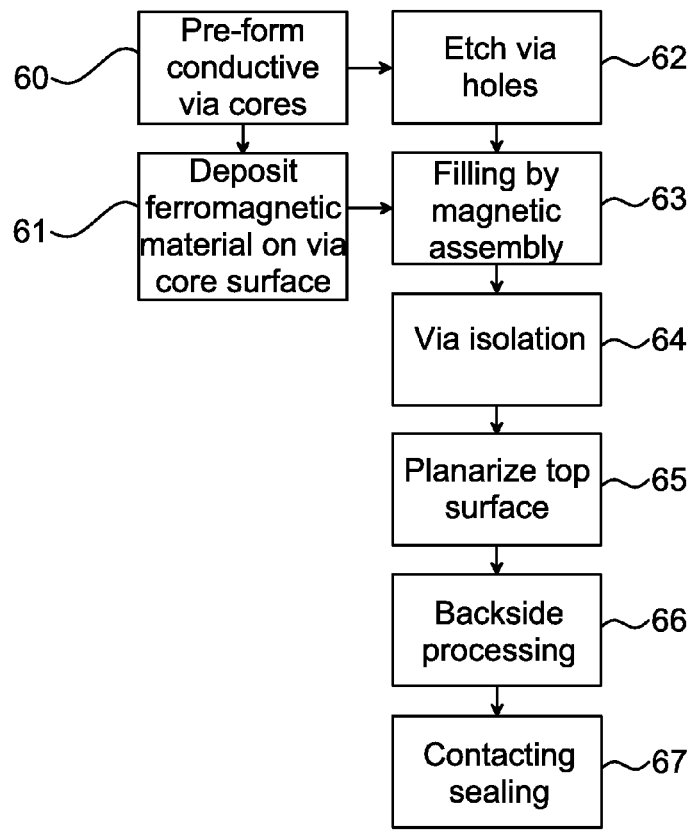
Figures 6B, 6C:
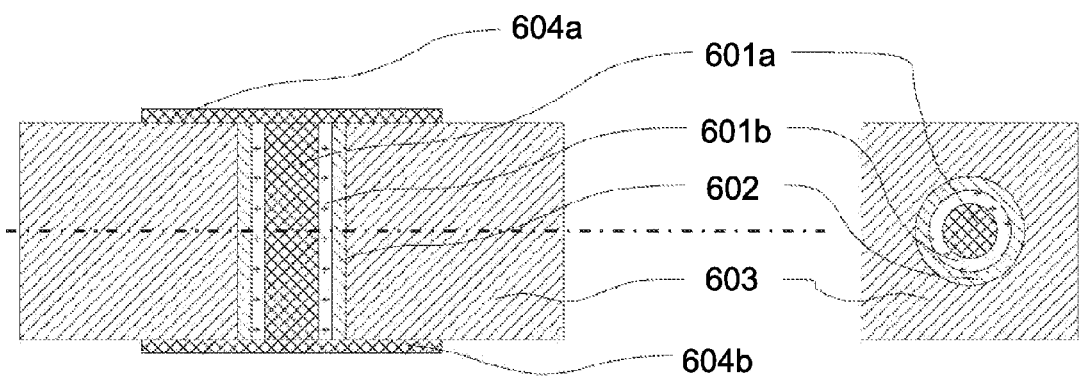

In a yet further embodiment, a method for fabricating a component comprising a substrate with TSV's, including the arrangement of multiple preformed electrically conductive objects at least partly comprising ferromagnetic material in through substrate via holes by a magnetic assembly process, is provided as being illustrated in FIGS. 6a-c. This embodiment differs from the embodiment of FIGS. 4a-c in that the preformed objects are formed by providing electrically conductive via cores on which a ferromagnetic material is deposited.

FIG. 6a is a flow chart of a representative process flow for fabricating a component comprising a substrate with TSV's. The preformed electrically conductive via cores are formed in a step 60 and a ferromagnetic material is deposited on the via cores in a step 61. Methods for step 61 may be evaporation, electroplating, electroless plating, atomic layer deposition or any other deposition process. The electrically conductive via cores may be made of or comprising Au, Cu, and/or Tu. The ferromagnetic material may as above comprise Ni, Co, and/or Fe.

The remaining process steps are as disclosed above. The vias are etched in a step 62; the magnetic assembly method is performed in step 63, the dielectric filler is deposited in step 64; the top surface of the substrate is planarized in step 65; grinding and polishing processes are performed on the backside of the substrate in a step 66; and the TSV's are electrically contacted and/or hermetically encapsulated in step 67.

FIGS. 6b-c illustrate a portion of the fabricated component comprising the substrate 603 with one TSV including the preformed object comprising the electrically conductive via core 601a and the ferromagnetic coating 601b, and the dielectric filler material 602. The metallization layers 604a and 604b contacting and sealing the TSV are also illustrated.

Figure 7A:
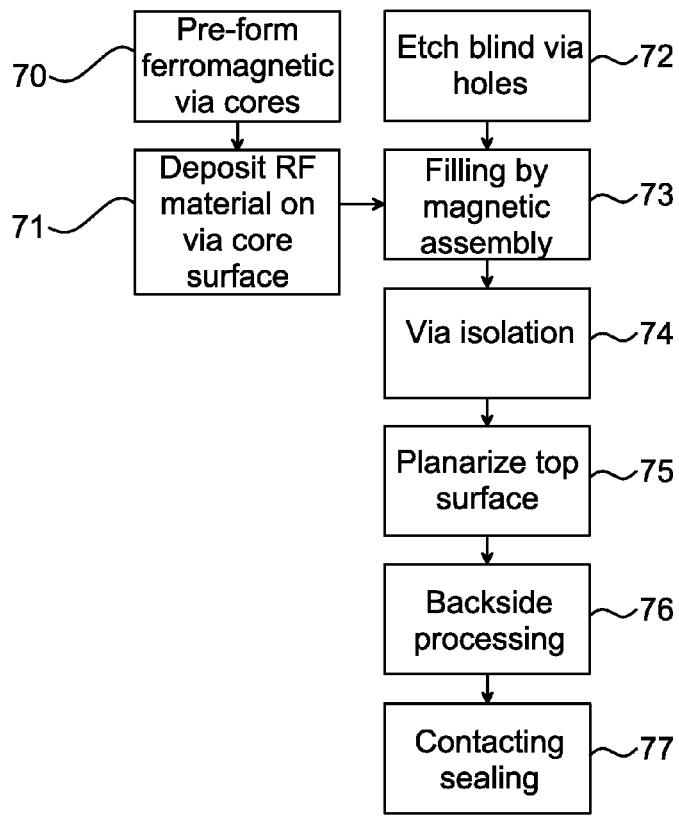
Figures 7B, 7C:
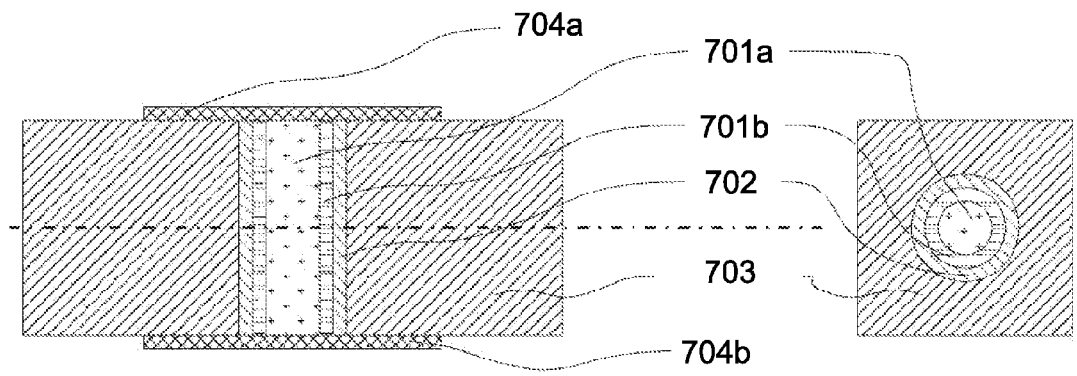

In a still further embodiment, a method for fabricating a component comprising a substrate with TSV's, including the arrangement of multiple preformed electrically conductive objects at least partly comprising ferromagnetic material in through substrate via holes by a magnetic assembly process, is provided as being illustrated in FIGS. 7a-c. This embodiment differs from the embodiment of FIGS. 6a-c in that the preformed objects are formed by providing ferromagnetic via cores on which a electrically conductive material is deposited.

FIG. 7a is a flow chart of a representative process flow for fabricating a component comprising a substrate with TSV's. The preformed ferromagnetic via cores are formed in a step 70 and an electrically conductive material is deposited on the via cores in a step 71. Methods for step 71 may be evaporation, electroplating, electroless plating, atomic layer deposition or any other deposition process. The use of special metallization such as e.g. gold for layer 701b can result in a high performance via suitable for the transmission of RF signals.

The remaining process steps are as disclosed above. The vias are etched in a step 72; the magnetic assembly method is performed in step 73, the dielectric filler is deposited in step 74; the top surface of the substrate is planarized in step 75; grinding and polishing processes are performed on the backside of the substrate in a step 76; and the TSV's are electrically contacted and/or hermetically encapsulated in step 77.

FIGS. 7b-c illustrate a portion of the fabricated component comprising the substrate 703 with one TSV including the preformed object comprising the ferromagnetic via core 701*a* and the electrically conductive coating 701*b*, and the dielectric filler material 702. The metallization layers 704*a* and 704*b* contacting the TSV are also illustrated.

In a yet further embodiment, a method for fabricating a component comprising a substrate with TSV's, including the arrangement of multiple preformed electrically conductive objects at least partly comprising ferromagnetic material in through substrate via holes by a magnetic assembly process, is provided as being illustrated in FIGS. 8*a-c*. This embodiment differs from the embodiment of FIGS. 4*a-c* in that the preformed objects are formed by providing electrically conductive via cores which comprises ferromagnetic material. A dielectric layer is deposited on the via cores and then an electrically conductive layer is deposited on the dielectric layer in order to form a coaxial conductor.

FIG. 8*a* is a flow chart of a representative process flow for fabricating a component comprising a substrate with TSV's. The preformed electrically conductive via cores comprising a ferromagnetic material are formed in a step 80 and a dielectric layer is deposited on the via cores in step 81 and an electrically conductive layer is deposited on the dielectric layer in step 82. Methods for step 81 may include standard deposition techniques such as e.g. PECVD, PVD of dielectrics such as polymers, ceramics, glass, etc. known in the art. Some material may require a subsequent thermal cure or sinter. Methods for step 82 may be evaporation, electroplating, electroless plating, atomic layer deposition or any other deposition process The remaining process steps are as disclosed above. The vias are etched in a step 83; the magnetic assembly method is performed in step 84, the dielectric filler is deposited in step 85; the top surface of the substrate is planarized in step 86; grinding and polishing processes are performed on the backside of the substrate in a step 87; and the TSV's are electrically contacted and/or hermetically encapsulated in step 88.

FIGS. 8*b-c* illustrate a portion of the fabricated component comprising the substrate 803 with one TSV including the preformed object comprising the electrically conductive via core 801*a* comprising ferromagnetic material, the dielectric layer 802 deposited thereon, and the electrically conductive layer 801*b* deposited thereon, and the dielectric filler material 802*b*. The metallization layers 804*a* and 804*b* contacting and sealing the TSV are also illustrated.

Figure 9A:
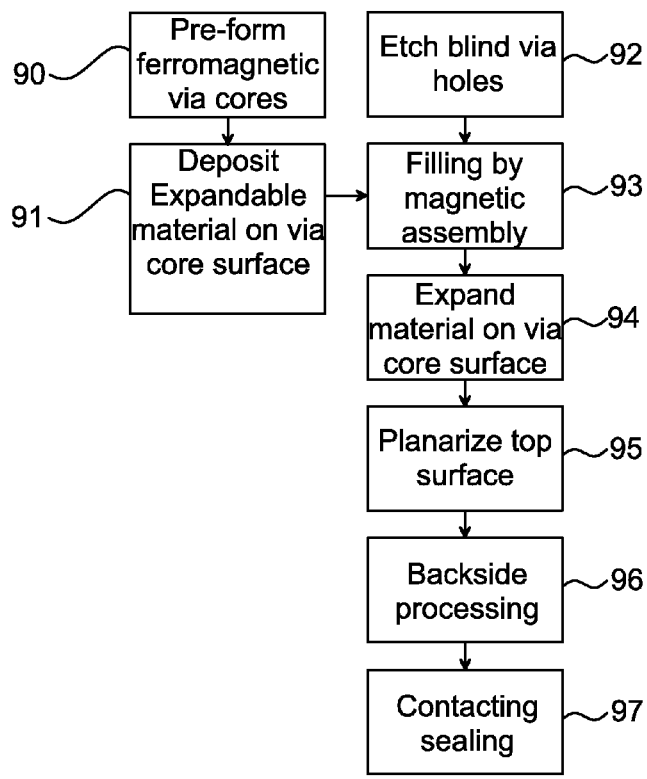
Figures 9B, 9C:
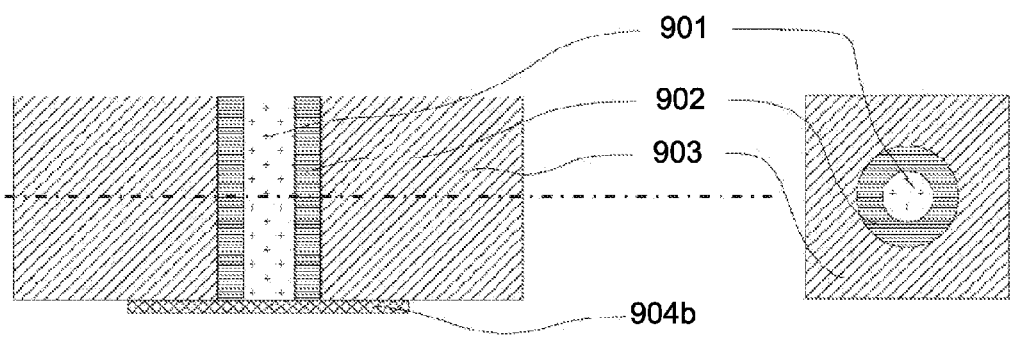

In a still further embodiment, a method for fabricating a component comprising a substrate with TSV's, including the arrangement of multiple preformed electrically conductive objects at least partly comprising ferromagnetic material in through substrate via holes by a magnetic assembly process, is provided as being illustrated in FIGS. 9*a-c*. This embodiment differs from the embodiment of FIGS. 4*a-c* in that the preformed objects are formed by providing electrically conductive via cores comprising a ferromagnetic material, on which an expandable dielectric material is deposited. Then, instead of filling the space between the via core and the inner side walls of the via holes with a dielectric filler material, the expandable dielectric material deposited on the via cores are made to expand to thereby fixate the via cores in the via holes.

FIG. 9*a* is a flow chart of a representative process flow for fabricating a component comprising a substrate with TSV's. The preformed electrically conductive via cores comprising ferromagnetic material are formed in a step 90 and the expandable dielectric is formed in step 91. Methods may include standard deposition techniques such as e.g. PECVD or PVD of dielectrics such as polymers, ceramics, glass, etc. known in the art. The expandable dielectric material has the ability to expand its volume.

The vias are etched in a step 92; the magnetic assembly method is performed in step 93, the expandable dielectric material is made to expand in step 94; the top surface of the substrate is planarized in step 95; grinding and polishing processes are performed on the backside of the substrate in a step 96; and the TSV's are electrically contacted in step 97. The expansion in step 94 may be triggered by a thermal treatment or after addition of a liquid or gaseous chemical agent.

FIGS. 9*b-c* illustrate a portion of the fabricated component comprising the substrate 903 with one TSV including the preformed object comprising the electrically conductive via core 901 comprising ferromagnetic material and the dielectric material 902 after expansion. A metallization layer 904 contacting the TSV is also illustrated.

In a still further embodiment, a method for fabricating a component comprising a substrate with TSV's, including the arrangement of multiple preformed electrically conductive objects at least partly comprising ferromagnetic material in through substrate via holes by a magnetic assembly process, is provided as being illustrated in FIGS. 10*a-c*. This embodiment differs from the embodiment of FIGS. 4*a-c* in that the preformed objects comprise each a first end portion and a second end portion opposite to the first end portion, and the first end portion comprises electrically conductive material and the second end portion comprises a ferromagnetic material.

FIG. 10*a* is a flow chart of a representative process flow for fabricating a component comprising a substrate with TSV's. The preformed objects comprising ferromagnetic material are formed in steps 110, 111.

The vias are etched in a step 112; the magnetic assembly method is performed in step 113, the dielectric filler material is deposited in step 114; the top surface of the substrate is planarized in step 115; grinding and polishing processes are performed on the backside of the substrate in a step 116; and the TSV's are electrically contacted in step 117.

FIGS. 10*b-c* illustrate a portion of the fabricated component comprising the substrate 1003 with one TSV including the preformed object 1001*a*, 10001*b* and the dielectric material 1002. Metallization layers 1004*a* and 1004*b* for contacting the TSV are also illustrated.

Figure 11:
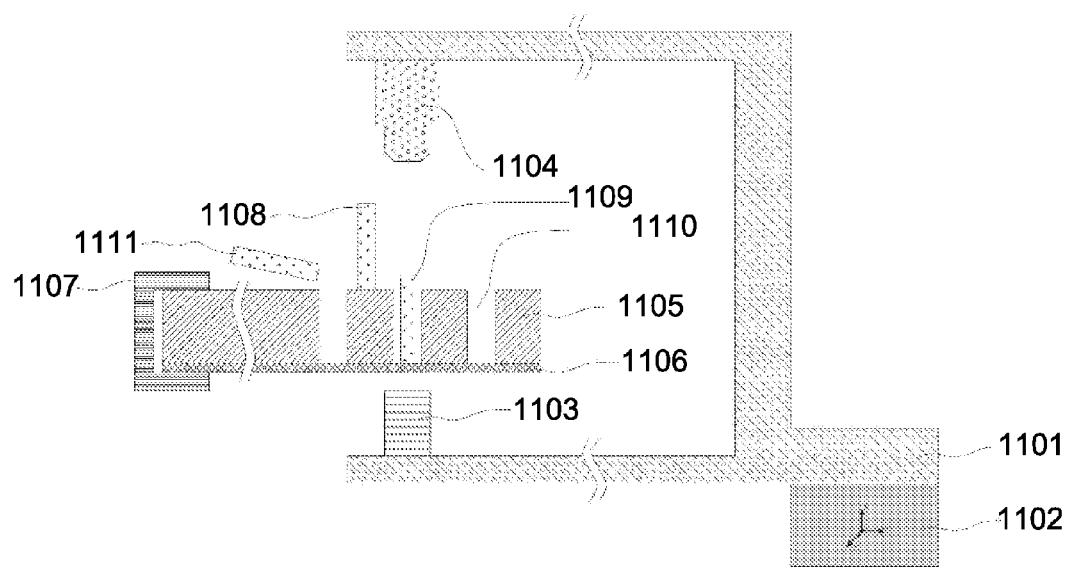
FIG. 11 illustrates, in a cross-sectional view, an apparatus for forming conductive vias in a substrate according to an embodiment of the invention.

FIG. 11 illustrates, in a cross-sectional view, an apparatus for forming conductive vias in a substrate according to an embodiment of the invention. The apparatus comprises "fork" frame structure 1101 with one part above the substrate 1105 and one part below the substrate 1105. An xyz-stage 1102 with a moving range in the horizontal plane xy on the order of the size of the substrate 1105. The vertical movement z can either be used for tuning the magnetic field by a change of the distance between one or multiple magnetic sources 1103 and the substrate 1105 or to focus one or multiple cameras 1104. The one or multiple cameras 1104 is/are either aligned or not aligned to the one or multiple magnetic sources 1103.

The substrate 1105, which typically is a wafer, is provided with through via holes 1110. A layer 1106 is arranged at the backside of the substrate 1105 deposited by any means. Alternatively an additional carrier substrate is arranged at the backside of the substrate 1105.

A substrate fixture 1107 is provided, which holds the substrate during the magnetic assembly method, and may further insert additional mechanical energy, such as e.g. vibration, in order to support the assembly process.

During the assembly method, the one or multiple magnetic sources 1103 provide(s) a magnetic field, thereby at least partly aligning at least a portion of a plurality of preformed objects 1109 arranged on an upper surface of the substrate 1105 and the stage 1102 moves the one or multiple magnetic sources 1103 relative to the substrate 1105, thereby moving the at least portion of the preformed objects 1109 into at least a portion of the via holes 1110.

A controller such as e.g. a personal computer (not illustrated) is arranged to control the stage 1102 and to get feedback from the one or multiple cameras 1104 with information if a via hole 1110 is empty, if a via hole 1110 filled correctly with a preformed object 1109, if a preformed object 1108 stands upright on the substrate surface, or if a preformed object 1111 is tilted/lying on the substrate surface.

It shall be appreciated that the one or multiple cameras 1104 may be exchanged for any kind of detection device for detecting the amount of the preformed objects 1108, 1109, 1111 that has been moved into the at least portion of the via holes 110. Such detection device comprises a device for detecting preformed objects in the via holes optically, electromagnetically, or physically.

It shall further be appreciated that the motion concept may alternatively be revered, i.e. the substrate 1105 will be moved and the magnetic source(s) 1103 and camera(s) 1104 are fixed.

Figure 12:
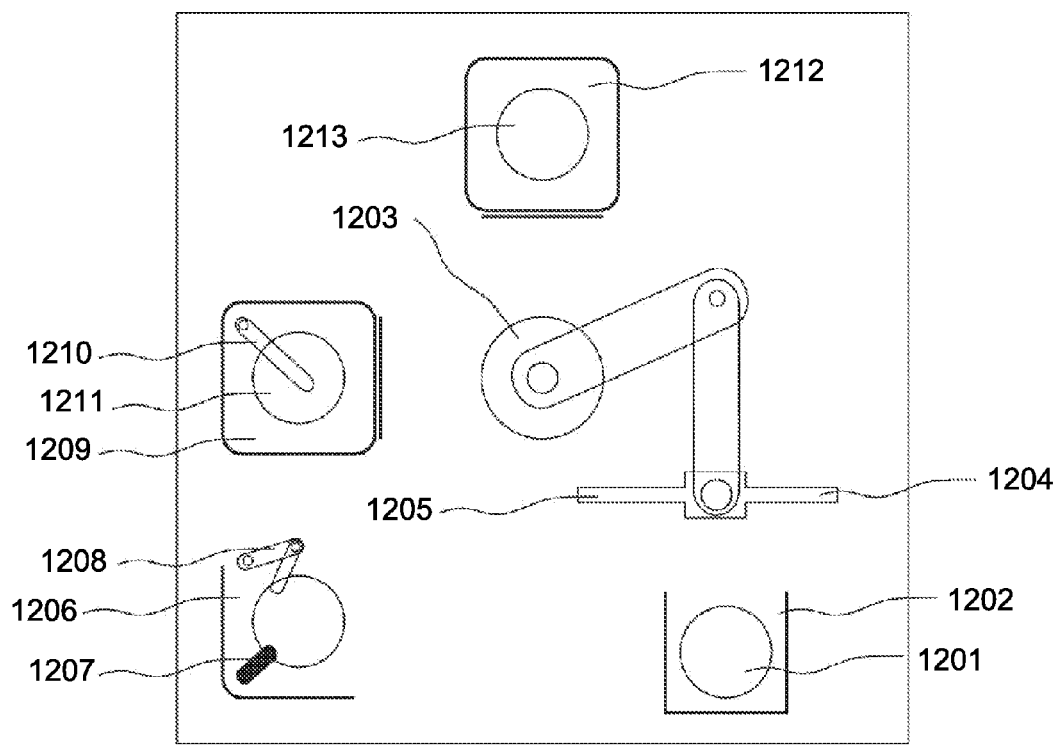
FIG. 12 illustrates, in a top view, a robot-based manufacturing system including the apparatus for forming conductive vias of FIG. 11.

FIG. 12 illustrates, in a top view, a robot-based manufacturing system including the apparatus for forming conductive vias of FIG. 11.

A wafer or substrate 1201 is stored in a standard input/output cassette 1202, which is typically formed to store 25 wafers. A standard wafer handling robot 1203 with two tool arms 1204, 1205 is provided. Examples of a wafer handling robot to be used are found at http://www.iselrobotik.com/waferhandler_01.php. One of the tool arms 1204 is preferably a standard vacuum gripper, which grips the substrates 1201, whereas the other one of the tool arms 1205 may be a magnetic assembly tool similar to the fork frame structure 1101 of FIG. 11.

The system comprises further a magnetic assembly station 1206 with a wafer fixture 1207 similar to the fixture 1107 of FIG. 11 and a deposition unit/robot 1208 for deposition of the preformed objects on the upper surface (front side) of the wafer 1201.

The system may further comprise a standard spin coating unit 1209 with a rotational wafer chuck 1211 and a deposition unit for liquids 1210 such as e.g. polymers and a standard hot and cool plate 1213 optionally in vacuum environment 1212.

During processing a substrate 1201 is fetched from standard input/output cassette 1202 with the standard vacuum gripper 1204 and is moved to the magnetic assembly station 1206 and is put in the wafer fixture 1207. A defined amount of preformed objects is placed on the substrate 1201 by means of the deposition unit/robot 1208. The magnetic assembly tool 1205 is aligned with the wafer 1201 such that the magnetic source(s) and camera(s) thereof are arranged below and above the wafer 1201. The preformed objects are arranged in the via holes of the substrate 1201 by means of the method disclosed with reference to FIG. 11. Then, the substrate 1201 is fetched with the standard vacuum gripper 1204 and placed in the standard spin coating unit 1209. A polymer is deposited by the deposition unit for liquids 1210 and the wafer 1201 is fetched with the standard vacuum gripper 1204 and placed at the standard hot and cool plate 1213 wherein a polymer curing procedure is run. Then, the wafer 1201 is fetched with the standard vacuum gripper 1204 and is returned to the standard input/output cassette 1202, and a new wafer can be fetched.

It shall be appreciated that the invention also relates to a component comprising a substrate with via holes, each of which being filled with an object comprising electrically conductive material surrounded by dielectric material, as well as to an interposer device comprising a plurality of the components in a stacked fashion wherein at least some of the via holes are through holes and each of the preformed objects filling said through holes provides electrical connection from one to another one of the components. The substrates may be of glass or of a semiconductor materiel such as silicon.

While the invention has been described above by way of example, it shall be understood that the same may be varied in several details. The scope of the present patent is defined by the following claims.

The invention claimed is:

1. A method for forming conductive vias in a substrate by filling preformed via holes with electrically conductive material, the method comprising:
   providing a plurality of preformed objects at least partly comprising ferromagnetic material on a surface of the substrate;
   providing a magnetic source on an opposite side of the substrate with respect to the plurality of preformed objects, thereby at least partly aligning at least a portion of the preformed objects with a magnetic field associated with the magnetic source; and
   moving the magnetic source relative the substrate, or vice versa, thereby moving the at least portion of the preformed objects into at least a portion of the via holes;
   wherein the preformed objects in the via holes are fixated therein by filling the space between the objects and the sidewalls of the via holes with a filler material.

2. The method of claim 1 wherein the preformed objects comprise each a core and a layer formed thereon.

3. The method of claim 2 wherein the core is of an electrically conductive material and the layer formed thereon is of a ferromagnetic material.

4. The method of claim 2 wherein the core is of a ferromagnetic material and the layer formed thereon is of an electrically conductive material.

5. The method of claim 1 wherein the preformed objects comprise each a multilayer structure including at least two parallel conductors preferably arranged coaxially, electrically isolated from one another.

6. The method of claim 1 wherein the preformed objects comprise each a first end portion and a second end portion opposite to the first end portion, and the first end portion is of an electrically conductive material and the second end portion is of a ferromagnetic material.

7. The method of claim 1 wherein the preformed objects comprise each a core of a ferromagnetic material and a layer of an expandable dielectric material formed thereon, and the preformed objects in the via holes are fixated therein by means of expanding the expandable dielectric layer.

8. The method of claim 1 wherein the surface of the substrate, on which the preformed objects at least partly comprising ferromagnetic material are provided, is planarized after the at least portion of the preformed objects have been moved into the at least portion of the via holes.

9. The method of claim 1 wherein the via holes are hermetically sealed by means of covering them by at least one layer, preferably an electrically conductive layer, after the at least portion of the preformed objects have been moved into the at least portion of the via holes.

10. A component comprising a substrate with via holes, each of which being filled with an object comprising electrically conductive material surrounded by dielectric material, wherein:
    said objects comprise each ferromagnetic material; and
    said dielectric material fixates the objects in the via holes.

11. The component of claim 10 wherein the preformed objects comprise each a core and a layer formed thereon, wherein one of the core and the layer is of an electrically conductive material and the other one of the core and the layer is of a ferromagnetic material.

12. The component of claim 10 wherein the objects comprise each a multilayer structure including at least two parallel conductors.

13. An apparatus for forming conductive was in a substrate by filling preformed via holes with conductive material, wherein the apparatus comprises
- a magnetic source arranged at one or more sides of the substrate for providing a magnetic field, thereby at least partly aligning at least a portion of a plurality of preformed objects arranged on a surface of the substrate, and
- means for moving the magnetic source relative to the substrate, or vice versa, thereby moving the at least portion of the preformed objects into at least a portion of the via holes;
- wherein the preformed objects in the via holes are fixated therein by filling the space between the objects and the sidewalls of the via holes with a filler material.

14. The apparatus of claim 13 wherein the means for moving is provided for moving the magnetic source while the substrate is held still or is provided for moving the substrate while the magnetic source is held still.

15. The apparatus of claim 13 wherein the means for moving is provided for moving both the magnetic source and the substrate.

16. The apparatus of claim 13 wherein the means for moving is provided for moving the magnetic source relative to the substrate in different horizontal directions.

17. The apparatus of claim 13 wherein the means for moving is provided for moving the magnetic source relative to the substrate in a vertical direction.

18. The apparatus of claim 15 comprising a detection device for detecting the amount of the preformed objects that has been moved into the at least portion of the via holes.

19. The apparatus of claim 18 wherein the detection device comprises a device for detecting preformed objects in the via holes optically, electromagnetically, or physically.

20. The apparatus of claim 15 comprising a substrate holder provided for holding the substrate during the movement of the magnetic source relative to the substrate.

21. The apparatus of claim 19 comprising a robot arranged to (i) hold the magnetic source during the movement of the magnetic source relative to the substrate and hold the detection device during the detection of the size of the at least portion of the preformed objects that has been moved into the at least portion of the via holes; or to (ii) hold the substrate during the movement of the magnetic source relative to the substrate and during the detection of the amount of the preformed objects that has been moved into the at least portion of the via holes.

22. An automated robot-based manufacturing system comprising the apparatus for forming conductive vias as claimed in claim 15; an input/output cassette for storing wafers provided with via holes; a substrate holder provided for holding the substrate during the formation of the conductive vias; a deposition unit/robot arranged to deposit preformed objects on the upper surface of the wafer while being held by the substrate holder; and a wafer handling robot arranged to move a wafer from the input/output cassette to the substrate holder.

23. The system of claim 22 comprising a spin coating unit equipped with a deposition unit for curable liquids and a curing unit, wherein the wafer handling robot is arranged to move the wafer from the substrate holder for holding the substrate during the formation of the conductive vias to the spin coating unit after the conductive vias have been formed; the deposition unit for liquids is arranged to deposit curable liquid onto the wafer; the wafer handling robot is arranged to move the wafer from the spin coating unit to the curing unit after the liquid has been deposited; the curing unit is arranged to cure the deposited liquid; and the wafer handling robot is arranged to move the wafer from the curing unit back to the input/output cassette after the deposited liquid has cured.

24. The system of claim 22 wherein the wafer handling robot holds the apparatus for forming conductive vias during the formation of the conductive vias.

\* \* \* \* \*